United States Patent
Kim et al.

(10) Patent No.: US 6,180,488 B1
(45) Date of Patent: Jan. 30, 2001

(54) METHOD OF FORMING SEPARATING REGION OF SEMICONDUCTOR DEVICE

(75) Inventors: Jun Ki Kim, Seoul; Jin Won Park, Chungcheongbuk-do, both of (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/196,766

(22) Filed: Nov. 20, 1998

(30) Foreign Application Priority Data

Dec. 26, 1997 (KR) ................................. 97-74390

(51) Int. Cl.[7] .......................... H01L 21/76; H01L 21/311
(52) U.S. Cl. ......................... 438/424; 438/445; 438/696
(58) Field of Search ................................... 438/424, 445, 438/446, 444, 696

(56) References Cited

U.S. PATENT DOCUMENTS

| | | | |
|---|---|---|---|
| 5,346,584 | 9/1994 | Nasr et al. | 156/636 |
| 5,433,794 | 7/1995 | Fazan et al. | 148/33.3 |
| 5,866,435 * | 2/1999 | Park | 437/65 |
| 5,945,352 * | 8/1999 | Chen et al. | 438/713 |
| 5,960,297 * | 9/1999 | Saki | 438/424 |
| 5,972,773 * | 10/1999 | Liu et al. | 438/424 |
| 6,051,478 * | 4/2000 | Ibok | 438/424 |

* cited by examiner

*Primary Examiner*—Amir Zarabian
*Assistant Examiner*—Adam J Pyonin
(74) *Attorney, Agent, or Firm*—Fleshner & Kim, LLP (57) ABSTRACT

A separating region and a method of forming a separating region of a semiconductor device is provided that increases reliability of the device by isolating respective gate electrodes. The separating region and method prevent voids from being formed within a trench of the separating region. The method of forming the separating region includes forming patterns of first insulating layers on a semiconductor substrate by selectively etching the first insulating layers to have at least one opening disposed in a defined region of the semiconductor substrate, forming side walls of a second insulating layer on both lateral sides of the patterns of the first insulating layers, and etching the side walls of the second insulating layer and the exposed semiconductor substrate using the patterns of the first insulating layers as a mask to form trenches in the semiconductor substrate. Since a selectively ratio of the sidewalls and the semiconductor substrate is preferably 1:1, the trenches have a prescribed shape and depth. The trenches become narrower top to bottom. A third insulating layer is formed on the surface of the patterns of the first insulating layers including inside the trenches. The third insulating layer is selectively etched to expose the upper part of the patterns of the first insulating layers and form the device separating layer.

20 Claims, 8 Drawing Sheets

METHOD OF FORMING SEPARATING REGION OF SEMICONDUCTOR DEVICE

BACKGROUND OF THE INVENTION

1. Field of the Invention

The present invention relates to a method for fabricating a semiconductor device and, more particularly, to a method of forming a separating region of a semiconductor device.

2. Background of the Related Art

For integrated circuit development of semiconductor devices, various methods to minimize the size of a device separating region and an active region or device forming region have been developed. LOCal Oxidation of Silicon (LOCOS) is one common method of forming a device separating region because of the simplicity and high reproducibility of the LOCOS process.

The separating oxide layer formed by the LOCOS, however, has its own "bird's beak" problem. The "bird's beak" occurs at the edge of a separating oxide layer and extends to the active region, which decreases the active region size. Thus, LOCOS is not suitable for a use in a Dynamic Random Access Memory (DRAM) device greater than 64 MB.

For 64 MB or 256 MB DRAMs, an advanced LOCOS technique has been developed to form a separating region. In the advanced LOCOS technique, the bird's beak is prevented or removed to reduce the separating region but increase the active region. However, the characteristic of such advanced LOCOS technique separating regions can deteriorate in DRAMs of greater than gigabytes, which must have the cell region less than 0.2 $\mu m^2$ in area. Since the advanced LOCOS separating region occupies much space and the field oxide layer is in contact with the silicon substrate, the concentration of the silicon substrate is reduced with a consequence of leakage current.

For DRAMs greater than gigabytes, there has been disclosed a method of forming the separating region by using a trench. The trench separating region permits easy regulation of the separating region thickness and a high efficiency of separation.

Figure 1:
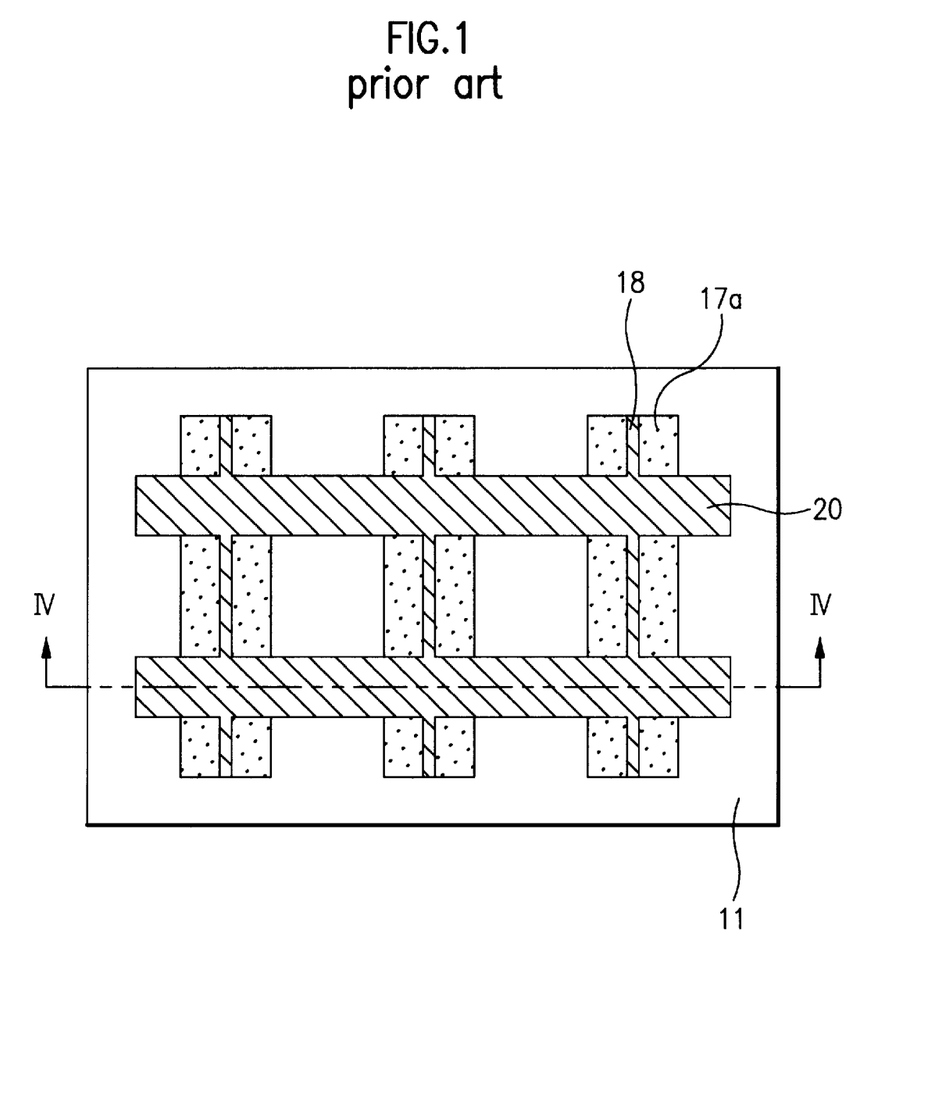
FIG. 1 is a diagram illustrating a plan view of a related art semiconductor device.

A method of forming a separating region of a related art semiconductor device will now be described. FIG. 1 is a plan view of a related art semiconductor device.

As shown in FIG. 1, active and field regions are defined in a semiconductor device 11. In the active region, separating layers 17a are each formed extending in the same direction at regular intervals. Gate electrodes 20 extend in a direction perpendicular to the device separating layers 17a to cross at predetermined intervals. Further, voids 18 formed on the surface of the device separating layers 17a are filled with conductive layers, which are used in forming a gate electrode, and connect adjacent gate electrodes 20 so that a current can flow there between.

Figure 2A:
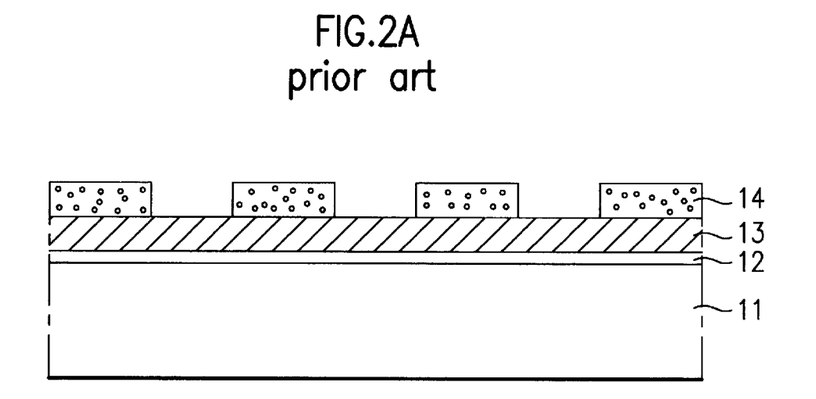
FIGS. 2a–2g are diagrams illustrating cross-sectional views of a method of forming a separating region of the related art semiconductor device of FIG. 1.

FIGS. 2a–2g are cross-sectional views along the line IV—IV of FIG. 1 that illustrate a method of forming a separating region of the related art semiconductor device. As shown in FIG. 2a, there are sequentially formed a first oxide layer 12 and a nitride layer 13 on silicon the substrate 11. A photo resist 14 is then deposited and patterned on the nitride layer 13.

Figure 2B:
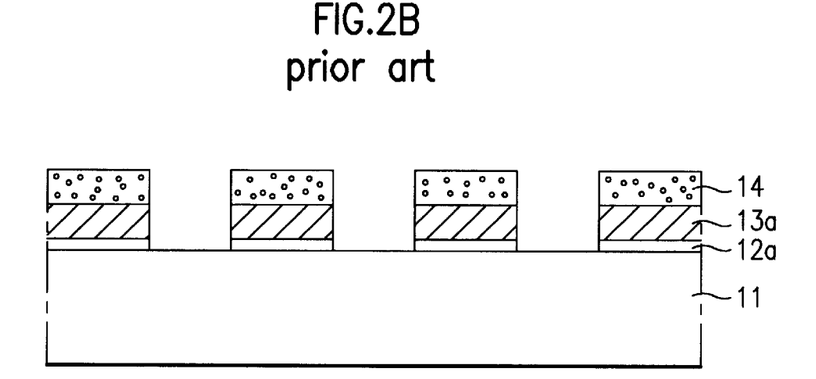

As shown in FIG. 2b, using the patterned photo resist 14 as a mask, the nitride layer 13 and the first silicon oxide layer 12 are selectively etched. Patterns 13a and 12a of the nitride layer 13 and the first silicon oxide layer 12 are respectively formed to define field and active regions. The active region is defined where the patterns 13a and 12a of the nitride layer 13 and the first silicon oxide layer 12 remain, while the field region is defined where the patterns 13a and 12a are eliminated.

Figure 2C:
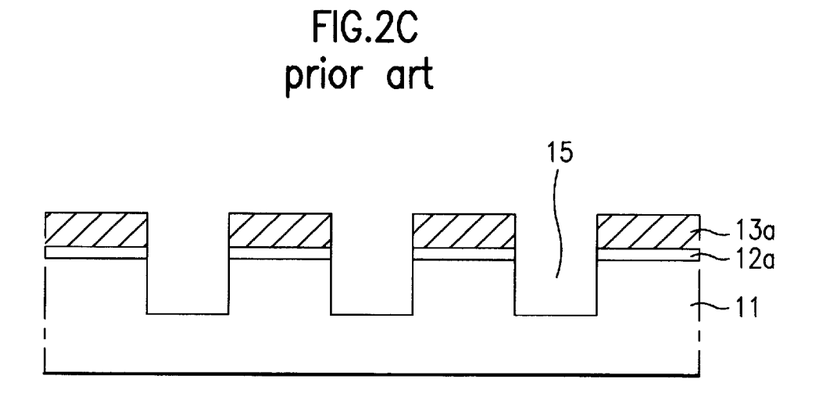

As shown in FIG. 2c, following removal of the photo resist 14, the field region of the silicon substrate 11 is anisotropically etched to a defined depth. The anisotropic etching uses the pattern 13a of the nitride layer 13 as a mask to form a plurality of trenches 15. The trenches 15 have sharp side angles.

Figure 2D:
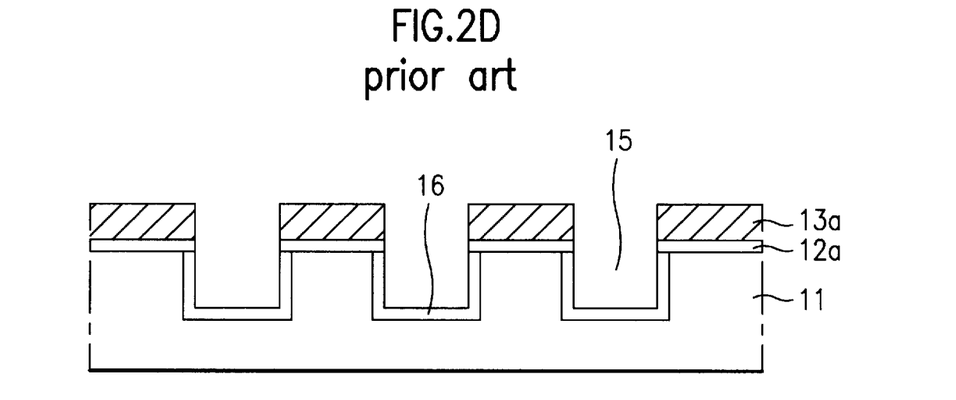
Figure 2E:
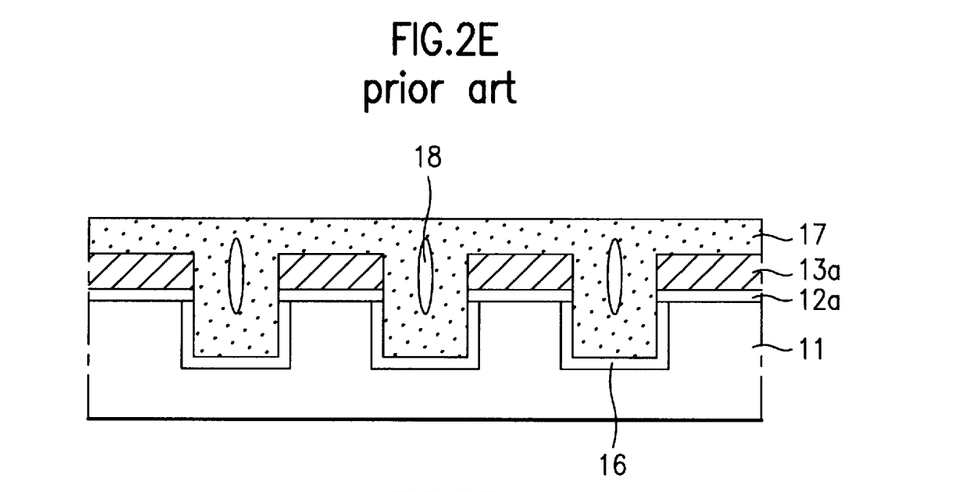

As shown in FIG. 2d, an oxidation is conducted on the silicon substrate 11 including the trenches 15 to form a second silicon oxide layer 16 on the trenches 15. As shown in FIG. 2e, a High Density Plasma (HDP) oxide layer 17 is formed on the whole surface of the silicon substrate 11 including the trenches 15. The side angles of the trenches 15 are so steep that voids 18 are produced in the trenches 15 in the step of forming the HDP oxide layer 17.

Figure 2F:
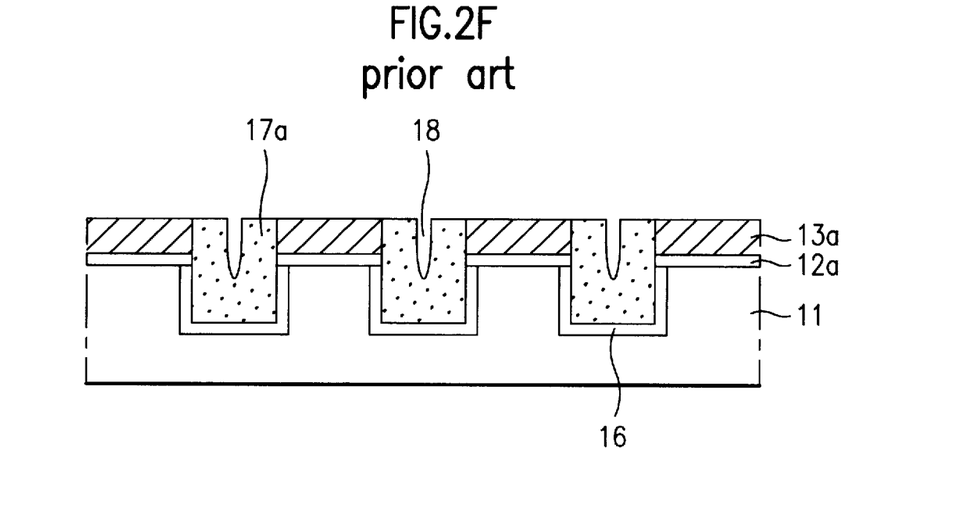

As shown in FIG. 2f, the HDP oxide layer 17 is subjected to Chemical Mechanical Polishing (CMP) to have the surface of the pattern 13a of the nitride layer 13 exposed. In this manner, device separating layers 17a inside the trenches 15 are formed. On the surface of the device separating layers 17a, however, the voids 18 are exposed.

Figure 2G:
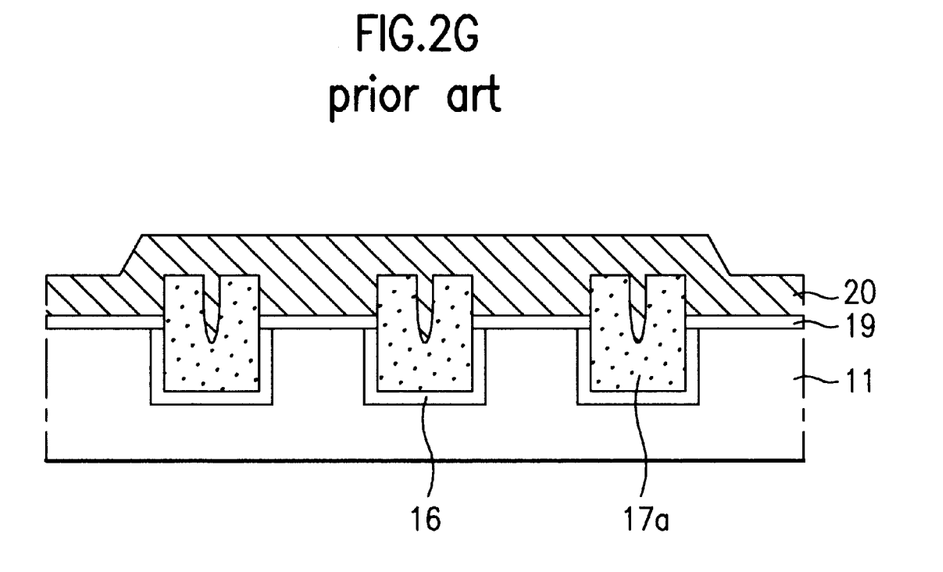

As shown in FIG. 2g, following removal of the patterns 13a and 12a of the nitride layer 13 and the first silicon oxide layer 12, a gate insulating layer 19 and a conductive layer for gate electrode (not shown) are formed on the whole surface of the silicon substrate 11. The gate insulating layer 19 and the conductive layer are selectively etched to form a gate electrode 20. The gate electrode 20 is partly overlapped with and perpendicular to the device separating layers 17a, and the gate insulating layer 19 is disposed on the active region of the silicon substrate.

The method of forming the separating region of the related art semiconductor device has several disadvantages. Voids occur inside the separating region trenches during a deposition of the insulating layer because of sharp side angles of the trenches. The voids permit current flow between the gate electrodes, which should be isolated from each other, resulting in failures of a device. Further, the gate insulating layer disposed in the contact region between the device separating layers and the silicon substrate may be eliminated in a subsequent cleaning step, which exposes the silicon substrate and leads to deterioration of the gate insulating layer reliability.

The above references are incorporated by reference herein where appropriate for appropriate teachings of additional or alternative details, features and/or technical background.

SUMMARY OF THE INVENTION

An object of the present invention is to provide a method of forming a separating region of a semiconductor device that substantially obviates one or more of the problems caused by limitations and disadvantages of the related art.

Another object of the present invention is to provide a method of forming a separating region of a semiconductor device that increases device reliability.

Another object of the present invention is to provide a method for forming a separating region of a semiconductor device that prevents void formation in the field region.

Another object of the present invention is to provide a method for forming a separating region of a semiconductor device that increases reliability of the gate insulating layer.

Another object of the present invention is to provide a method for forming a separating region of a semiconductor device that prevents current flow between gate electrodes of gigabyte or higher DRAMS.

To achieve at least these objects and other advantages in a whole or in parts and in accordance with the purpose of the present invention, as embodied and broadly described, a method of forming a separating region of a semiconductor device includes forming a first insulating layer on a semiconductor substrate, selectively removing the first insulating layer to form a pattern having at least one opening in a prescribed region of the semiconductor substrate, forming side walls of a second insulating layer on sides of the first insulating layer pattern, removing the side walls of the second insulating layer and the semiconductor substrate using the first insulating layer pattern as a mask to form trenches in the semiconductor substrate, forming a third insulating layer on the first insulating layer pattern to fill the trenches and selectively removing the third insulating layer to expose an upper surface of the first insulating layer pattern to form a device separating layer.

To further achieve the above objects in a whole or in parts, there is provided a method of fabricating a field region in a semiconductor device according to the present invention that includes forming a first insulating layer on a semiconductor substrate, forming patterns of the first insulating layer by selectively etching the first insulating layer to expose prescribed regions of the semiconductor substrate, forming side walls of a second insulating layer lateral sides of the patterns of the first insulating layer, etching the side walls of the second insulating layer and the semiconductor substrate using the patterns of the first insulating layer as a mask to form trenches in the prescribed regions of the semiconductor substrate, forming a third insulating layer that covers the patterns of the first insulating layers, the sidewalls and the trenches and selectively etching the third insulating layer to expose an upper surface of the patterns of the first insulating layer to form separating regions.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 3:
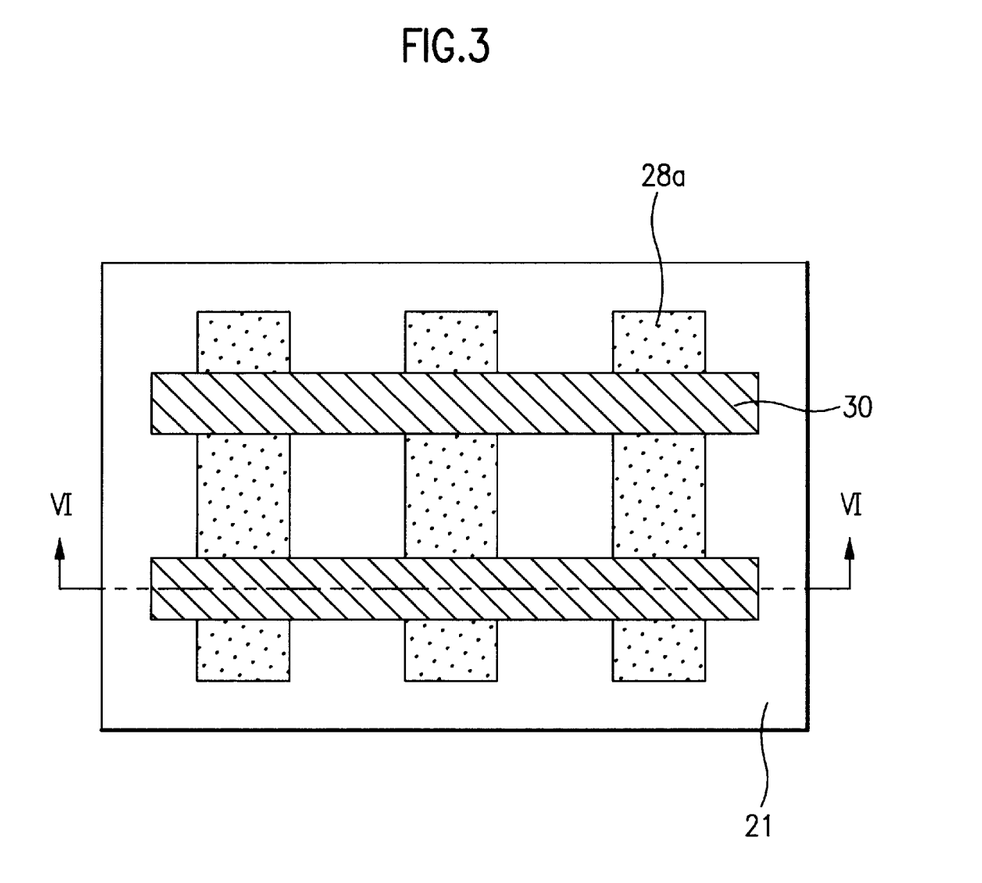
FIG. 3 is a diagram illustrating a plan view of a preferred embodiment of a semiconductor device in accordance with the present invention.

FIG. 3 is a diagram showing a preferred embodiment of a semiconductor device according to the present invention.

As shown in FIG. 3, active and field regions are defined in a semiconductor device 21. In the active region, a plurality of separating layers 28a are each formed extending in a first direction at prescribed intervals. Gate insulating layers 29 (Not shown) partly overlap with and extend in a second direction substantially perpendicular to the first direction of the device separating layers 28a at prescribed intervals so that gate electrodes 30 are completely isolated from each other.

FIGS. 4a–4h are cross-sectional views illustrating a preferred embodiment method of forming a separating region of a semiconductor device according to the present invention. The cross-sectional views in FIGS. 4a–4h are along the line VI—VI of FIG. 3, although the present invention is not intended to be so limited.

Figure 4A:
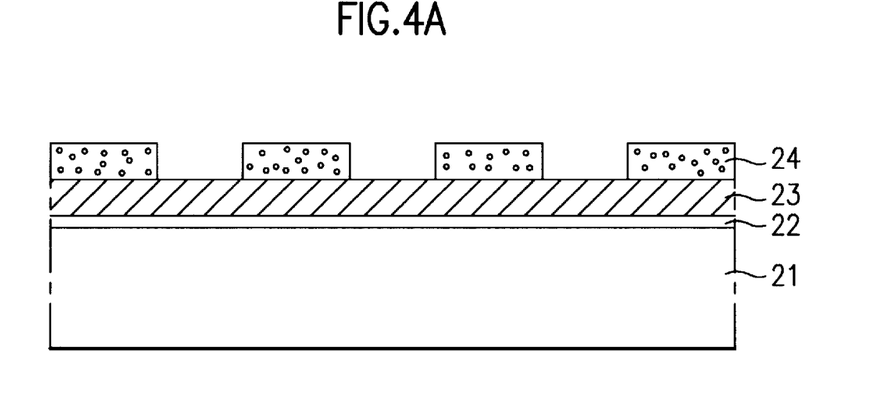
FIGS. 4a–4h are diagrams illustrating cross-sectional views of a preferred embodiment of a method of forming a separating region of a semiconductor device in accordance with the present invention.

As shown in FIG. 4a, a silicon substrate 21 is subjected to an oxidation to form a first insulating layer 22, which preferably consists of silicon oxide on the silicon substrate 21. The first insulating layer 21 prevents corrosion in the silicon substrate 21 that may be caused by a reactive gas in subsequent steps or processes.

On the first insulating layer 22 is formed a second insulating layer 23, which preferably consists of a nitride material. The second insulating layer can be used as a mask in subsequent etching of the silicon substrate 21 and to prevent damage to the silicon substrate 21 in subsequent etching of an insulating layer such as a fifth insulating layer by a CMP technique. A photo resist 24 is then deposited and patterned on the second insulating layer 23 through an exposure and a development.

Figure 4B:
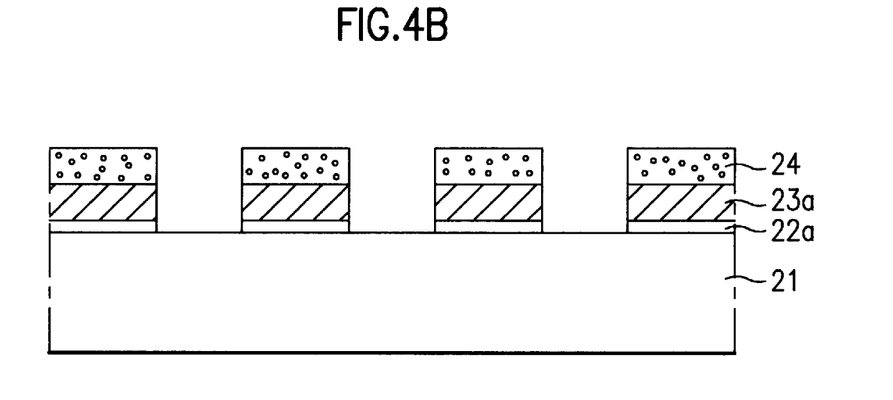

As shown in FIG. 4b, using the patterned photo resist 24 as a mask, the second and first insulating layers 23 and 22 are selectively etched. Patterns 23a and 22a of the second and first insulating layers 23 and 22. are respectively formed to define field and active regions. The active region is defined where the patterns 23a and 22a of the second and first insulating layers 23 and 22 remain, while the field region is defined where the patterns 23a and 22a are eliminated.

Figure 4C:
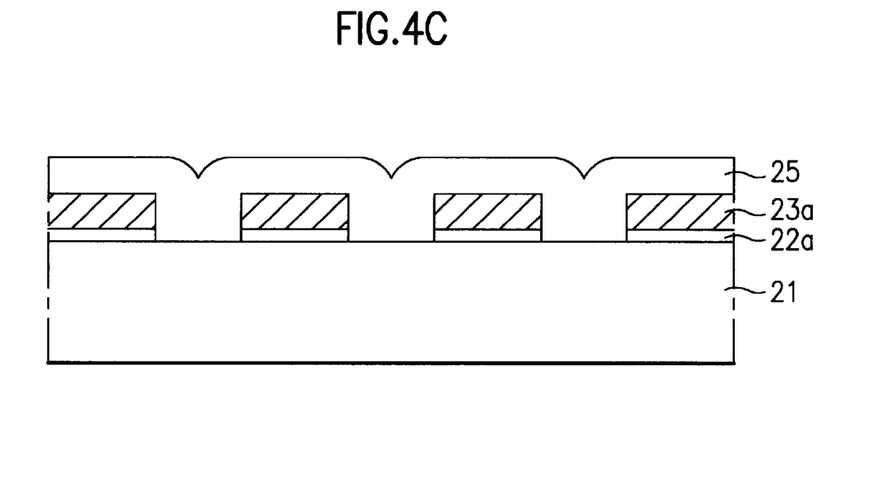

As shown in FIG. 4c, following removal of the photo resist 24, on the whole surface of the silicon substrate 21 including the second insulating layer pattern 23a is formed a third insulating layer 25. The third insulating layer 25 preferably consists of silicon oxide or polysilicon, which has a high etching selectivity ratio with respect to the pattern 23a.

Figure 4D:
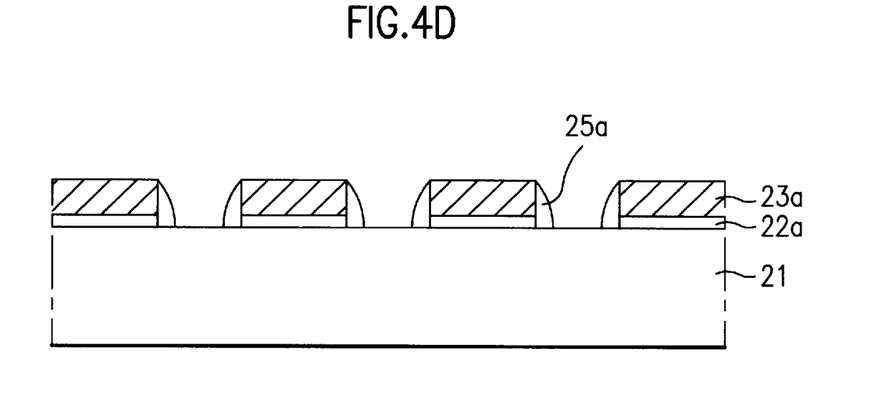

As shown in FIG. 4d, the third insulating layer 25 is subjected to an anisotropic etching step to form side walls 25a on both lateral sides of the patterns 23a and 22a of the second and first insulating layers 23 and 22.

Figure 4E:
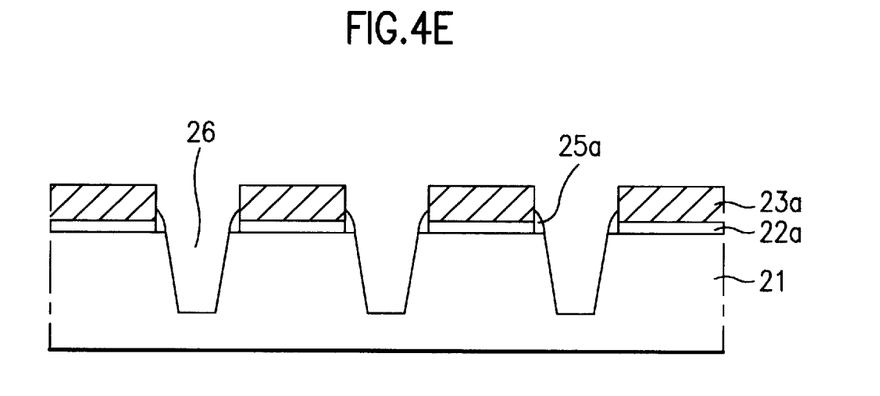

As shown in FIG. 4e, the side walls 25a of the third insulating layer 25 and the field region of the silicon substrate 21 are subjected to an anisotropic etching step using the pattern 23a of the second insulating layer 23 as a mask. The anisotropic etching forms a plurality of trenches 26 having a prescribed depth.

The etching selectivity ratio between the side walls 25a and the silicon substrate 21 is preferably 1:1. That is, the etching rate of the side walls 25a is equal to or slightly higher than that of the silicon substrate 21.

Thus, the inside profile of each of the trenches 26 in the silicon substrate 21 is preferably like the profile of the side walls 25a of the third insulating layer 25 formed on both lateral sides of the pattern 23a of the second insulating layer 23. Accordingly, the trenches 26 get narrower from the top to the bottom portion.

Figure 4F:
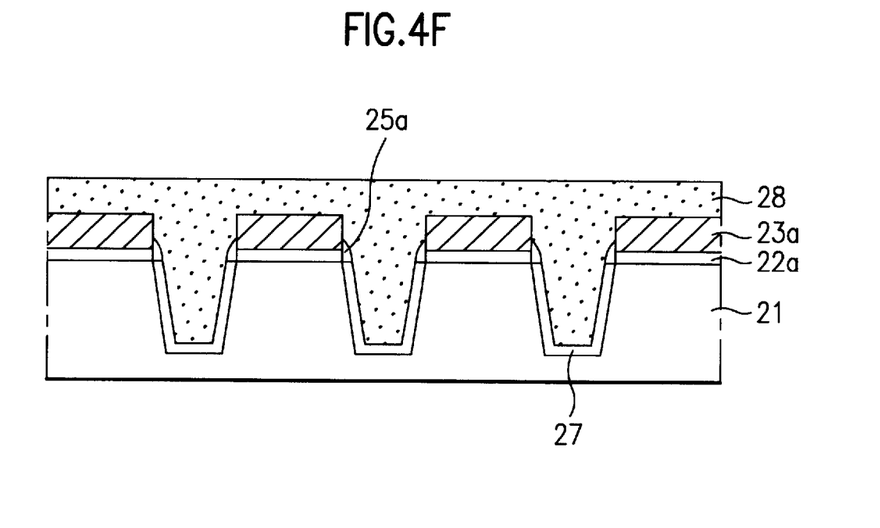

As shown in FIG. 4f, an oxidation is conducted on the silicon substrate 21 including the trenches 26 to form a fourth insulating layer 27. The fourth insulating layer 27 preferably consists of silicon oxide on the trenches 26. The fourth insulating layer 27 is to protect the silicon substrate 21 against damages and contaminating matters incurred by forming the trenches 26.

Figure 4G:
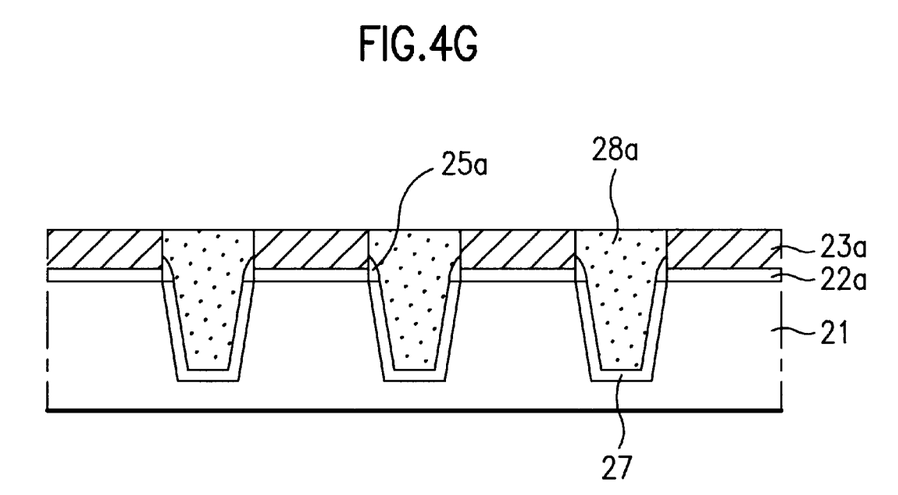

A fifth insulating layer 28 is then formed on the whole surface of the silicon substrate 21 including the trenches 26. The fifth insulating layer preferably consists of an HDP oxide material. As shown in FIG. 4g, the fifth insulating layer 28 is subjected to a CMP technique to expose the surface of the pattern 23a of the second insulating layer 23. Thus, device separating layers 28a are formed inside the trenches 26.

Figure 4H:
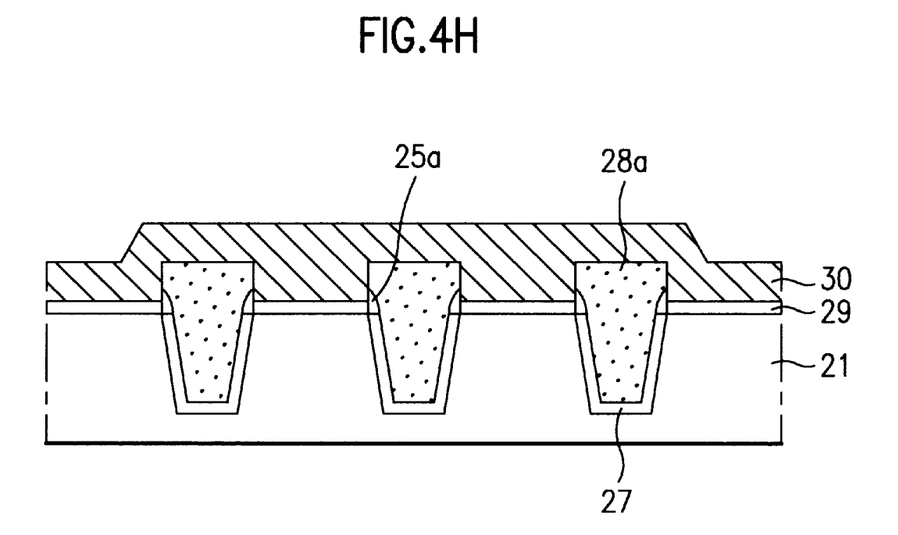

As shown in FIG. 4h, following removal of the patterns 23a and 22a, a gate insulating layers 29 and a conductive layer for gate electrode (not shown) are formed on the whole surface of the silicon substrate 21 including the device separating layers 28a. After the removal of the patterns 23a and 22a, the side walls 25a of the third insulating layer 25 still remain. Accordingly, the gate insulating layer 29 is prevented from being etched between the device separating layers 28a and the silicon substrate 21 during a subsequent cleaning step or the like. Thereby, the reliability of gate insulating layer 29 is secured. Then, the conductive layer and the gate insulating layer 29 are selectively removed to form a gate electrode 30.

As described above, the preferred embodiment of a method of forming the separating region of a semiconductor device in accordance with the present invention has various advantages. The preferred embodiments prevent voids inside the trenches from forming during a deposition of the insulating layer because of obtuse side angles of the trenches. Thus, the preferred embodiments decrease a rate of failure in a semiconductor device. Further, the side walls are used to prevent a gate insulating layer from being etched in the contact region between device separating layers and silicon substrate in the subsequent cleaning step. Accordingly, the preferred embodiments secure the profile and increase the reliability of the gate insulating layer.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A method of forming a separating region of a semiconductor device, comprising:

forming a first insulating layer on a semiconductor substrate;

selectively removing the first insulating layer to form a pattern having at least one opening in a prescribed region of the semiconductor substrate;

forming side walls of a second insulating layer on sides of the first insulating layer pattern;

performing extraction of portions of the side walls of the second insulating layer and a portion of the semiconductor substrate therebetween using the first insulating layer pattern as a mask to form trenches with a prescribed depth in the semiconductor substrate;

forming a third insulating layer on the first insulating layer pattern to fill the trenches and cover remaining portions of the side walls; and selectively removing the third insulating layer to expose an upper surface of the first insulating layer pattern to form a device separating layer.

2. The method of claim 1, Wherein the semiconductor substrate is removed at a rate not less than the removing rate of the side walls of the second insulating layer to form the trenches.

3. The method of claim 1, wherein in the step of forming the side walls of the second insulating layer comprises:

forming the second insulating layer on the patterns of the first insulating layer pattern; and anisotropic etching the second insulating layer to form the sidewalls, wherein the first insulating layer has a laminated structure of a second insulator on a first insulator, and wherein a height of the remaining portions of the side walls is greater than a height of the first insulator.

4. The method of claim 1, wherein the first insulating layer has a laminated structure of an oxide layer and a nitride layer.

5. The method of claim 4, wherein the oxide layer is formed by performing an oxidation of the semiconductor substrate.

6. The method of claim 1, wherein the side walls of the second insulating layer are at least one of silicon oxide and polysilicon, wherein the trenches get narrower from top of bottom, and wherein a profile of a surface of the remaining portions of the side walls covered by the third insulating layer is the same as a profile of corresponding lateral walls of the trenches.

7. The method of claim 1, further comprising the step of forming a fourth insulating layer by performing an oxidation of the inside of the trenches prior to the step of forming the third insulating layer.

8. The method of claim 1, wherein the third insulating layer comprises a high density plasma oxide layer.

9. The method of claim 1, wherein the trenches are formed by an anisotropic etching using the pattern of the first insulating layer as a mask.

10. The method of claim 1, further comprising removing the first insulating layer pattern after the step of forming the third insulating layer.

11. The method of claim 1, wherein the device separating layer is formed by chemical mechanical polishing the third insulating layer to expose the upper surface of the first insulating layer pattern.

12. A method of forming a semiconductor device, comprising:

forming a first insulating layer on a semiconductor substrate;

forming patterns of the first insulating layer by selectively etching the first insulating layer to expose prescribed regions of the semiconductor substrate;

forming side walls of a second insulating layer lateral sides of the patterns of the first insulating layers;

concurrently etching portions of the side walls of the second insulating layer to a prescribed height and the semiconductor substrate therebetween using the patterns of the first insulating layers as a mask to form trenches with a prescribed depth in the prescribed regions of the semiconductor substrate;

forming a third insulating layer that covers the patterns of the first insulating layers, the etched sidewalls and the trenches; and selectively etching the third insulating layer to expose an upper surface of the patterns of the first insulating layers to form separating layers.

13. The method of claim 12, wherein the patterns of the first insulating layer are over active regions in the semiconductor substrate.

14. The method of claim 12, wherein the semiconductor substrate is etched at a rate substantially equal to the etching rate of the side walls of the second insulating layer to form the trenches having a prescribed shape.

15. The method of claim 14, wherein the trenches become narrower from a surface of the semiconductor substrate to a bottom of the trench, and wherein a profile of a surface of the etched sidewall covered by the third insulating layer is the same as a profile of a corresponding lateral wall of the trenches.

16. The method of claim 15, wherein the first insulating layer has a laminated structure of nitride layer on an oxide layer, wherein the side walls of the second insulating layer contains at least one of silicon oxide and polysilicon, and wherein the third insulating layer includes a high density plasma oxide layer.

17. The method of claim 12, further comprising forming an oxide layer by performing oxidation of the inside of the trenches prior to the step of forming the third insulating layer.

18. The method of claim 12, wherein the separating regions extend in a first direction substantially parallel to each other, further comprising:

removing the patterns of the first insulating layer;

forming gates electrodes extending in a second direction substantially perpendicular to the first direction, wherein the gate electrodes cross the separating regions.

19. The method of claim 12, wherein a cell region corresponding to an active region in the substrate under one of the patterned first insulating layers is less than approximately 0.2 $\mu m^2$ in size.

20. The method of claim 16, wherein a height of the etched sidewalls is greater than a height of an upper surface of the oxide layer.

\* \* \* \* \*